United States Patent [19]

Ono et al.

[11] 4,122,486
[45] Oct. 24, 1978

[54] SEMICONDUCTOR LIGHT-EMITTING ELEMENT

[75] Inventors: Yuichi Ono; Makoto Morioka; Kazuhiro Ito, all of Tokyo; Mitsuhiro Mori, Kokubunji; Masahiko Kawata; Kazuhiro Kurata, both of Hachioji, all of Japan

[73] Assignee: Hitachi, Ltd., Japan

[21] Appl. No.: 771,576

[22] Filed: Feb. 24, 1977

[30] Foreign Application Priority Data

Feb. 27, 1976 [JP] Japan .................................. 51-20007

[51] Int. Cl.² ............................................ H01L 33/00
[52] U.S. Cl. ...................................... 357/17; 357/16; 357/61
[58] Field of Search ....................... 357/17, 16, 30, 61

[56] References Cited

U.S. PATENT DOCUMENTS 4,017,881  4/1977  Ono ...................................... 357/18

Primary Examiner—Martin H. Edlow
Attorney, Agent, or Firm—Craig & Antonelli

[57] ABSTRACT

A light emitting element made of a group III - V compound semiconductor has a p-n junction and a heterojunction which are identical; the mixing ratio (band gap) of a p-type layer on the light emitting side is sufficiently smaller than that of an n-type layer on the opposite side. The semiconductor light-emitting element is especially useful as a light source, for optical communications, photoexcitation, etc.

10 Claims, 21 Drawing Figures

SEMICONDUCTOR LIGHT-EMITTING ELEMENT

BACKGROUND OF THE INVENTION

1. Field of the Invention

The invention relates to a semiconductor light-emitting element. More particularly, it relates to a semiconductor light-emitting element which is made of a group III–V compound semiconductor or a mixed crystal thereof and has a hetero p-n junction, and produces a high output or high brightness and is especially suitable for photoexcitation, optical communications, etc.

2. Description of the Prior Art

Heretofore, a light emitting element made of a group III–V compound mixed-crystal system and exhibiting a high output has been manufactured by forming a p-n junction in such a way that an acceptor impurity such as Zn is introduced by diffusion into an n-type compound semiconductor substrate which has a wide band gap and which serves to transmit light. Alternatively, a p-n junction is formed in such a way that epitaxial layers which are respectively doped with an acceptor impurity such as Zn and a donor impurity such as Te are successively deposited on the substrate by liquid epitaxial growth.

In prior art semiconductor ligh-emitting elements, in general, the mixing ratio (band gap) of the p-type layer is substantially equal to or slightly greater than that of the n-type layer. It is therefore difficult to make the injection efficiency of carriers and, accordingly, the luminous efficiency, considerably high.

It is well known that the luminous efficiency can be enhanced by contouring the light emitting surface of the light emitting element into the shape of a dome. The luminous efficiency in the prior art in the case of such dome-shaped light-emitting element is about 5–10%.

Although the above-mentioned value of luminous efficiency of 5–10% is employable for ordinary uses, it is not suitable for a variety of light emitting devices for optical communications, etc. which have recently been proposed as light sources for optical communications, etc. and in which an optical fiber and a light emitting element are integrally formed. In order to couple a light emitting element with an optical fiber, the light emitting surface of the light emitting element should not be dome-shaped, but should be flat. However, when the light emitting surface is flat, the luminous efficiency is about one order of magnitude lower than that in the case of the dome-shaped element.

Accordingly, in order to form a light source device for optical communications by coupling a light emitting element with an optical fiber, it is necessary to sharply enhance the luminous efficiency of the light emitting element.

As a light emitting element of a group III–V compound mixed-crystal system which exhibits a high luminous efficiency, has a flat light emitting surface, and exhibits a high output, there has been proposed a light emitting element wherein, on an n-type compound semiconductor substrate, a mixed-crystal epitaxial layer which has the same conductivity type as that of the substrate and whose band gap is greater than that of the substrate is formed, and an acceptor impurity such as Zn is diffused from the surface of the epitaxial layer deeper than a hetero-junction which is formed between the substrate and the epitaxial layer to thereby form a p-n junction within the substrate and to provide a carrier confinement region between the hetero-junction and the p-n junction, thus achieving enhancement of the light output from the surface of the p-type layer (Japanese Patent Application Public-disclosure No. 159688/1975).

There has also been proposed a light emitting element wherein a p-type mixed-crystal layer is sandwiched between another p-type mixed-crystal layer and an n-type mixed-crystal layer which have a greater band gap than the first-mentioned p-type layer, to form a double hetero-junction, the p-type mixed-crystal layer of the smaller band gap being used as a carrier confinement region, thus achieving enhancement of the light output from the n-type mixed-crystal layer (Optics Communications, Vol. 4, No. 4, pp. 307–309, December, 1971).

Since, however, in both these light emitting elements the boundary of the carrier confinement region on the light emitting side is the hetero-junction, they have the serious disadvantage that light is reflected by the hetero-junction and that the luminous efficiency is lowered. It is also difficult to contour the light emitting surface into the shape of a dome.

SUMMARY OF THE INVENTION

An object of the invention is to solve the problems of the prior art and to provide a semiconductor light-emitting element whose luminous efficiency is high and whose reliability and productivity are not inferior to those of prior art elements.

The invention for accomplishing the object consists in a compound semiconductor light-emitting having a p-n junction, wherein the p-n junction has the characteristics of a hetero-junction, the hetero-junction is disposed on the side opposite to the light emitting side, and the mixing ratio (band gap) of an n-layer is sufficiently larger than that of a p-layer, to thereby raise the injection efficiency of carriers and simultaneously to reduce the absorption of internal light emission, thus sharply enhancing the luminous efficiency.

BRIEF DESCRIPTION OF THE DRAWINGS

FIG. 2b is a diagram showing the band gaps of respective layers in the light emitting element shown in FIG. 2a;

DETAILED DESCRIPTION OF THE DRAWINGS

Figure 1A:
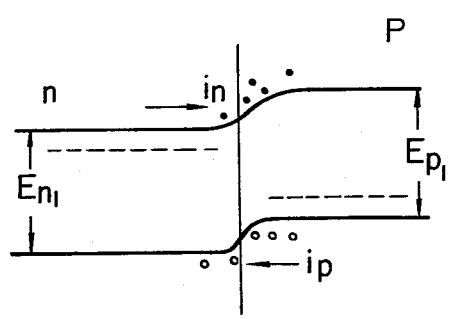
FIG. 1a and 1b are energy band diagrams in semiconductor light-emitting elements of the prior art and the invention, respectively.
Figure 1B:
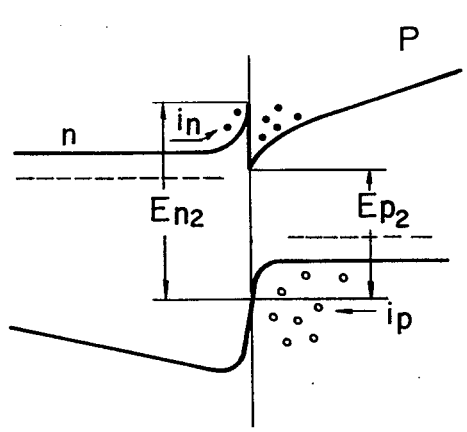

FIGS. 1a and 1b which are energy band diagrams of p-n junctions in a prior art semiconductor light-emitting element and a semiconductor light-emitting element according to this invention, respectively, illustrate the state under which a forward voltage is applied.

In FIGS. 1a and 1b the mark • represents an electron, and the mark o represents a hole. Letting $i_n$ and $i_p$ denote electron current and hole current, respectively, the total current $i_t$ which flows through the p-n junction is expressed by Eq. (1):

$$i_t = i_n + i_p \qquad (1)$$

The injection efficiency $\tau_{n\to p}$ of the electrons from an n-layer to a p-layer can be expressed substantially by Eq. (2):

$$\tau_{n\to p} = i_n/i_t \quad (2)$$

In the prior art semiconductor light-emitting element, as illustrated in FIG. 1a, the band gap $E_{p1}$ of the p-layer is slightly greater than or nearly equal to the band gap $E_{n1}$ of the n-layer, so that the currents $i_n$ and $i_p$ are nearly equal.

Accordingly, $$\tau_{n\to p} \doteq i_n/2i_n = \frac{1}{2} \quad (3)$$

On the other hand, according to the invention, as illustrated in FIG. 1b, the energy band gap $E_{n2}$ of the n-layer is sufficiently greater than the energy band gap $E_{p2}$ of the p-layer. Strictly speaking, $E_{n2} - E_{p2} - (2 \times$ the energy step of the conduction band) is a least $3 \cdot k \cdot T$ (0.078 eV) where $k$ denotes Boltzmann's constant and T is absolute temperature. In the actual case, heat generation occurs in the p-layer which is a light-emitting region, so that the difference value becomes considerably greater than $3 \cdot k \cdot T$.

Therefore, the hole current $i_p$ becomes almost zero. The phenomenon of accumulating holes takes place, and the injection efficiency $\tau_{n\to p}$ in this case can be expressed by Eq. (4):

$$\tau_{n\to p} = i_n/i_t = i_n/i_n = 1 \quad (4)$$

As is apparent from Eqs. (3) and (4), the injection efficiency of electrons in the invention is enhanced to approximately twice that in the prior art light-emitting device.

The injection efficiency $\tau_{n\to p}$ of carries (electrons) is also expressed by Eq. (5):

$$\tau_{n\to p} = 1/(1+\sqrt{\mu_h p/\mu_e n}) \quad (5)$$

where $n$, $p$ are carrier concentrations, $\mu_h$ is hole mobility, and $\mu_3$ is electron mobility.

As described above, when the band gap of the n-layer is large, the injection efficiency $\tau_{n\to p}$ also becomes large. However, there exists a point at which the electron mobility $\mu_e$ decreases abruptly, i.e., as regards GaAlAs etc., a point at which the direct transition region shifts to the indirect transition region. In a range beyond this point, the electron mobility $\mu_e$ is conspicuously small, and the injection efficiency $\tau_{n\to p}$ accordingly becomes a very small value as will be understood from Eq. (5).

Such a point is at 1.85 eV for GaAlAs. Therefore, when a light emitting element is formed using GaAlAs for the n-layer and GaAs (having a band gap of 1.44 eV) for the p-layer, the point at which the injection efficiency $\tau_{n\to p}$ becomes the maximum lies at $1.85-1.44 = 0.41$ eV in terms of the difference between the band gaps of both materials. Where the band gap of the n-type GaAlAs is greater than 1.85 eV and the difference between the band gaps of both the materials is greater than 0.41 eV, $\tau_{n\to p}$ is lowered.

Likewise, when GaAlAs is used for the n-type layer and GaAlAs having a band gap of 1.5 eV is used for the p-type layer, the point at which the injection efficiency of carriers becomes a maximum lies at 0.3 eV in terms of the difference between the band gaps of both materials. An increase in the difference value should be avoided.

Now, the structures of the semiconductor light-emitting device according to the invention will be described in detail with reference to FIGS. 2a-2c.

Figure 2A:
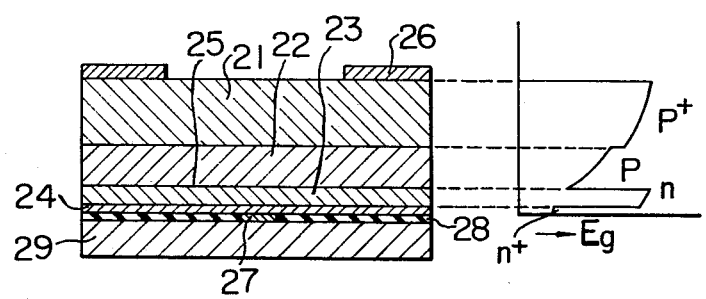
FIGS. 2a and 2c are partial sectional views showing different embodiments of the invention.
Figure 2B:
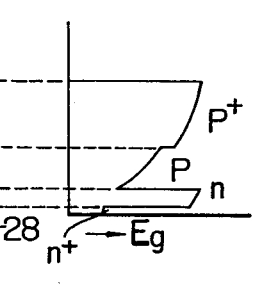
Figure 2C:
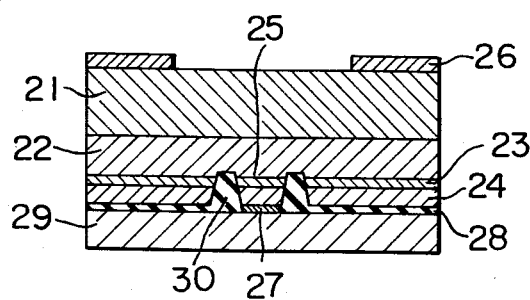

FIGS. 2a and 2c show different respective embodiments of the semiconductor device according to the invention. Numeral 21 designates a $p^+$-type crystal layer (100 to 200 μm thick) for emitting light having a broad band gap. Numerals 22, 23 and 24 designate a p-type layer, an n-type layer and an $n^+$-type layer which are formed on the $p^+$-type crystal layer 21 by the liquid epitaxial growth, respectively. An example of the energy band gaps $E_g$ of the respective layers is illustrated in FIG. 2b. In FIG. 2a and 2c, numeral 25 indicates a p-n junction, numerals 26 and 27 p-type and n-type ohmic contacts, respectively, numeral 28 a glass film for limiting current, numeral 29 an Au layer which is provided in order to endow the element with mechanical strength and to radiate heat to a heat sink, and numeral 30 is a groove which is provided around the electrode 27 in order to intensify the current limitation and in which glass or a metal oxide is buried.

In general, in highly efficient semiconductor light-emitting elements for optical communications, etc., the current density is 1–10 kA/cm² or so, and the quantity of heat generation in the vicinity of the p-n junction becomes considerably large. Needless to say, enhancement of the luminous efficiency causes generated heat to be efficiently radiated to the exterior.

The most important factor for enhancement of the luminous efficiency, however, is enhancement of the external quantum efficiency as well as the internal quantum efficiency. The invention makes the energy band gap (mixing ratio) of the n-layer lying in contact with the p-layer, the light emission region as illustrated in FIG. 1b sufficiently large to thereby raise the accumulation effect of holes as carriers and the injection efficiency of electrons as carriers and also to produce the reflection effect of internal light emission due to the difference between the refractive indices of the crystals, whereby the invention provides a sharp improvement in the luminous efficiency which has hitherto been very difficult. Since the difference of the band gaps in the vicinity of the boundary between the p-type layer 22 and the p-type layer 21 is extremely small, reflection of light hardly takes place at the boundary.

Figure 3:
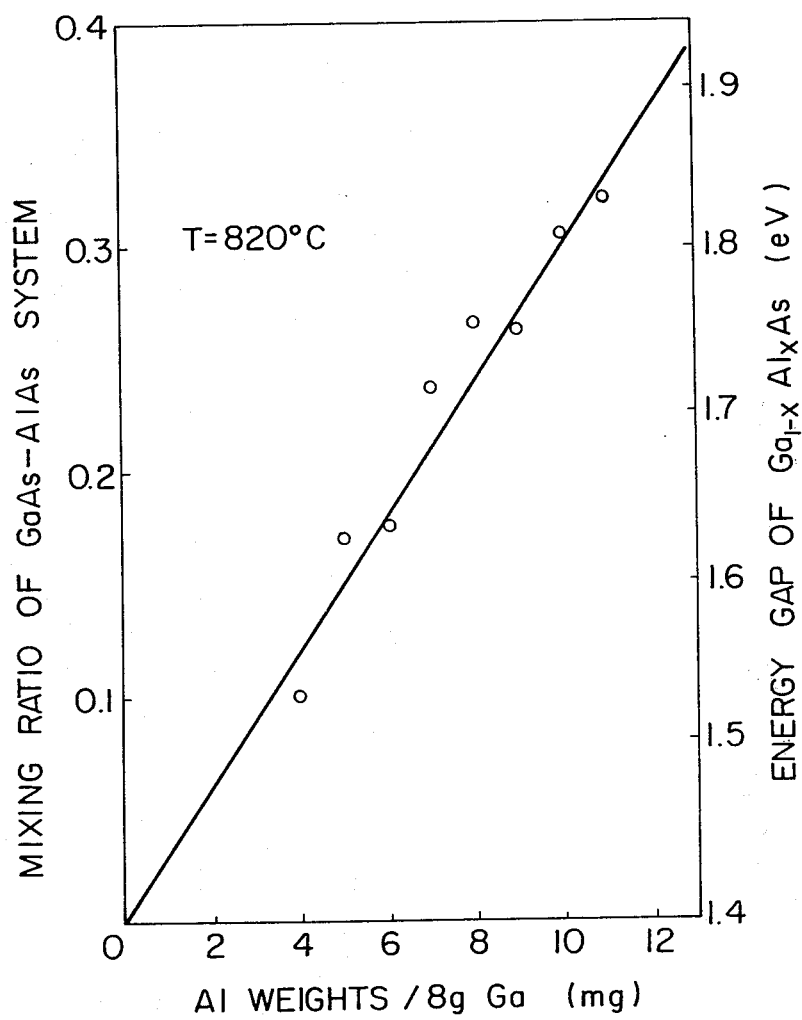
FIG. 3 is a diagram showing the relations between the weight of Al relative to Ga in $Ga_{1-x}Al_xAs$, and the mixing ratio and the energy gap of $Ga_{1-x}Al_xAs$.

FIG. 3 illustrates, for the case of employing $Ga_{1-x}Al_xAs$ of a mixed crystal between GaAs and AlAs as a semiconductor material, the relations between the weight of Al to that of Ga and the mixing ratio $x$ of the n-type $Ga_{1-x}Al_xAs$ and the corresponding energy gap $E_g$ (growth temperature: 820° C.)

As is apparent from FIG. 3, the relations between the Al weight and the mixing ratio and the energy gap become linear over a wide range. By way of example, a light emitting diode which was formed on n-type $Ga_{1-x}Al_xAs$ whose energy gap $E_g$ lay in a range of 1.68 eV–1.85 eV, i.e., whose mixing ratio $x$ lay in a range of about 0.2–0.35 (a range in which the Al weight was about 7–11 mg with respect to 8 gr. of Ga) and p-type $Ga_{1-x}Al_xAs$ (having a mixing ratio of 0.15) had a luminous efficiency which was at least twice as high as those of conventional light emitting diodes.

In a diode having an n-type layer whose energy gap $E_g$ is above 1.85 eV by further increasing the Al weight, a deterioration which is thought to be due to lattice distortions occurs. An energy gap $E_g$ exceeding 1.85 eV is therefore unfavorable in this respect in addition to the lowering of the luminous efficiency.

Since an n+-type layer 24 is used, the contact resistance with the electrode can be made extremely low, and in spite of the light emitting device of high input, the saturation phenomenon of the light emission output due to the heat generation can be prevented.

In order to efficiently couple the light emitting element with an optical fiber, the light emitting region of the element must be limited to be smaller than the diameter of the optical fiber. When, as shown in FIG. 2c, a shallow groove 30 (filled with the glass) extending from the n+-type layer 24 to the p-type layer 22 is provided around the electrode 27, the light emitting region can be made very small. Even with such a structure, the electrical characteristics of the light emitting element are not degraded, and satisfactory performance can be maintained as a light source for optical communication.

EXAMPLE 1

FIGS. 4a–4e illustrate the process of manufacturing a $Ga_{1-x}Al_xAs$ light-emitting diode whose light-emitting surface is flat, as shown in FIG. 2a.

On a p-type GaAs substrate (having a Zn acceptor concentration of about $1 \times 10^{17} cm^{-3}$), a $Ga_{1-x}Al_xAs$ ($x > 0.2$) film 21 having a thickness of 200 μm was formed by liquid epitaxial growth.

A melt employed for the liquid phase growth consisted of Ga as a solvent, Al and GaAs as solutes, and Zn as a dopant. Growth was started at about 900° C.

The acceptor concentration of the $Ga_{1-x}Al_xAs$ film 21 at the initial stage of the growth was measured by the capacitance - voltage method to be about $1 \times 10^{19}$ $cm^{-3}$.

Figure 4A:
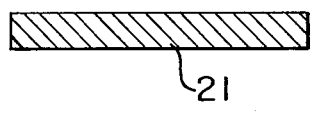
FIGS. 4a–4e, FIGS. 5a–5f and FIGS. 6a–6d are process diagrams for explaining different embodiments of the invention, respectively.

The substrate was removed by lapping, and the surface of the $Ga_{1-x}Al_xAs$ film 21 was polished to a mirror finished surface, to obtain a substrate for forming a p-n junction (FIG. 4a).

Figure 4B:
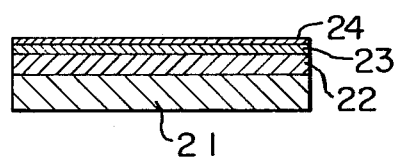

The $Ga_{1-x}Al_xAs$ substrate 21 was immersed in a melt consisting of 8 gr. of Ga, 0.55 gr. of CaAs and 0.05 gr. of Zn, and the temperature was gradually lowered from 850° C. Thus, as shown in FIG. 4b, a p-type $Ga_{1-x}Al_xAs$ layer 22 (having a thickness of about 20 μm and an acceptor concentration of $1 \times 10^{18} cm^{-3}$) was epitaxially grown on the substrate 21. Further, an n-type $Ga_{1-x}Al_xAs$ layer 23 (having a thickness of 2 μm and a donor concentration of about $1 \times 10^{18} cm^{-3}$) was formed under the growing conditions that the composition of a melt consisted of 8 gr. of Ga, 0.008 gr. of Al, 0.6 gr. of GaAs and 0.002 gr. of Te and that the growth temperature was 820° C. Subsequently, an n+-type $Ga_{1-x}Al_xAs$ layer 24 (having a thickness of about 1 μm and a donor concentration of about $5 \times 10^{18} cm^{-3}$) was formed under the growing conditions that the composition of a melt consisted of 8 gr. of Ga, 0.65 gr. of GaAs and 0.004 gr. of Te and that the growth temperature was 818° C.

The compositions of the epitaxial layers thus grown were analyzed by an X-ray microanalyzer; the mixing ratio of the p-type layer 22 was about 0.1, and that of the n-type layer 23 was about 0.25.

Figure 4C:
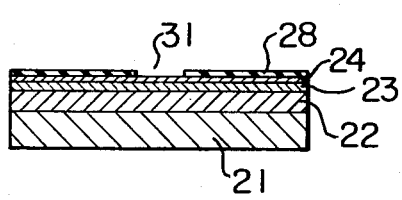

As is shown in FIG. 4c, a glass (a phosphorus silicate glass) layer 28 was deposited on the n+-type layer 24 by the chemical vapor deposition, and a window 31 for forming an electrode was provided by photoetching.

Figure 4D:
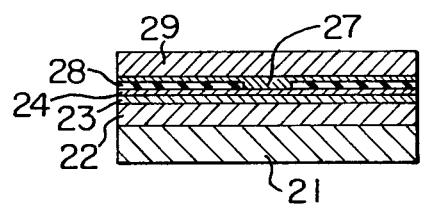

Subsequently, as is shown in FIG. 4d, an n-type ohmic electrode 27 made of a three-layer film of AuGe/Ni/Au was evaporated on the entire area of the surface of the resultant substrate. Further, a gold layer 29 was deposited thereon by electroplating.

Figure 4E:
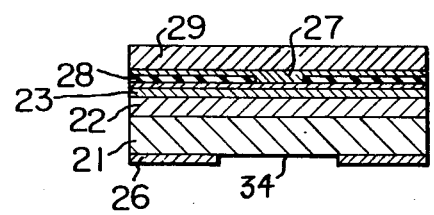

A p-type ohmic electrode 26 made of a two-layer film of AuZn/Au and having a window 34 for emitting light was evaporated on the opposite surface of the substrate 21 (FIG. 4e).

In this way, a light emitting diode having the structure shown in FIG. 2a and a band gap distribution shown in FIG. 2b is formed. The luminous efficiency of the light emitting diode is 3–4% which is a value much higher than the luminous efficiency, 1–2% of the prior art light emitting diode.

Similarly, regarding the light emission output, the prior art light-emitting diode exhibits a value of 2–4 mW, whereas this invention achieves a value of 5–10 mW, which is two or more times greater.

EXAMPLE 2

Referring to FIGS. 5a–5f, description will be made of the process of manufacturing a light emitting diode which has the structure shown in FIG. 2c.

Figure 5A:
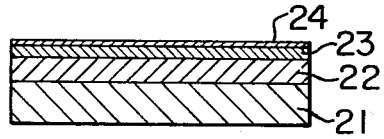

By the same methods as illustrated in FIGS. 4a and 4b in Example 1, a p-type layer 22, an n-type layer 23 and an n+-type layer 24 were successively deposited on a p+-type substrate 21, as shown in FIG. 5a.

Figure 5B:
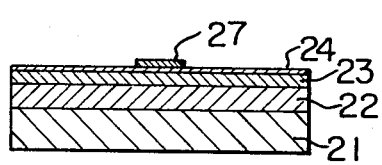

As shown in FIG. 5b, an n-type ohmic electrode 27 made of the same materials as in Example 1 was formed on the n+-type layer 24 by the vacuum evaporation and photoetching.

Figure 5C:
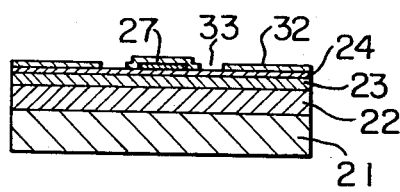
Figure 5D:
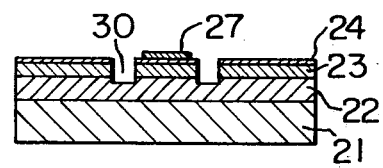

As shown in FIG. 5c, a silicon dioxide layer 32 was deposited on the entire area, whereupon a hole 33 getting to the n+-type layer 24 was provided. Further, using the hole 33, selective etching was performed to form a groove 30, as shown in FIG. 5d.

Figure 5E:
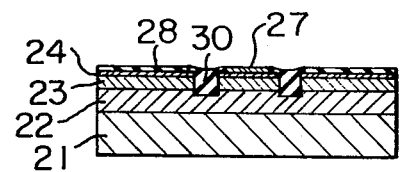

As shown in FIG. 5e, a glass layer 28 was deposited on the entire area, and the groove 30 was filled with glass. Subsequently, the glass layer 28 was photo-etched to expose the surface of the electrode 27.

Figure 5F:
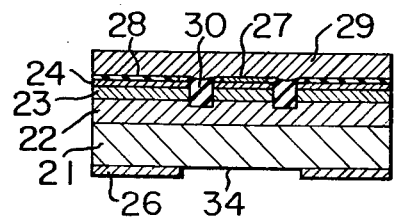

As is shown in FIG. 5f, and Au layer 29 was deposited on the entire area by vacuum evaporation. subsequently, a two-layer film of AuZn/Au was deposited on the part of the p+-type substrate 21 other than a window for emitting light, to form a p-type ohmic electrode 26. Then, a light emitting diode having the structure shown in FIG. 2c was obtained.

This light-emitting diode has the merit that, since the light emitting region can be made smaller than the core section of an optical fiber by the groove 30 surrounding the n-type ohmic electrode 27, the diode can be efficiently coupled with the optical fiber.

EXAMPLE 3

FIGS. 6a–6d illustrate the process of manufacturing a $Ga_{1-x}Al_xAs$ light-emitting diode whose light-emitting surface is dome shaped.

Figure 6A:
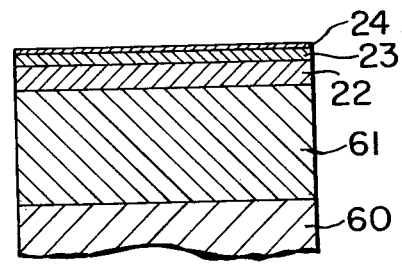

As is shown in FIG. 6a, an undoped $Ga_{1-x}Al_xAs$ layer ($x > 0.2$, 400 μm in thickness) 61, a p-type $Ga_{1-x}Al_xAs$ layer 22 (about $1 \times 10^{18} cm^{-3}$ of acceptor concentration, about 20 μm in thickness), an n-type $Ga_{1-x}Al_xAs$ layer 23 (about $1 \times 10^{18} cm^{-3}$ of donor concentration, about 2 μm in thickness) and an n+-type $Ga_{1-x}Al_xAs$ layer 24 ($5 \times 10^{18} cm^{-3}$ of donor concentration, about 1 μm in thickness) were successively grown on an n-type GaAs substrate 60 (about $1 \times 10^{17} cm^{-3}$ of donor concentration, doped with Te) by liquid phase epitaxial growth.

The respective mixing ratios of the p-type layer 22 and the n-type layer 23 were measured to be about 0.17 and about 0.3.

Figure 6B:
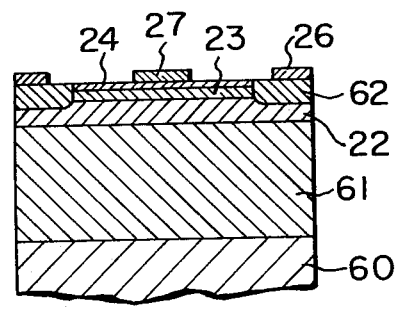

Subsequently, as is shown in FIG. 6b, a p$^+$-type layer 62 reaching the p-type layer 23 was formed at the peripheral edge part of the n$^+$-type layer 24 by selective diffusion. A p-type ohmic electrode 26 and an n-type ohmic electrode 27 were respectively formed on the p$^+$-type layer 62 and the n$^+$-type layer 24 by evaporation.

Figure 6C:
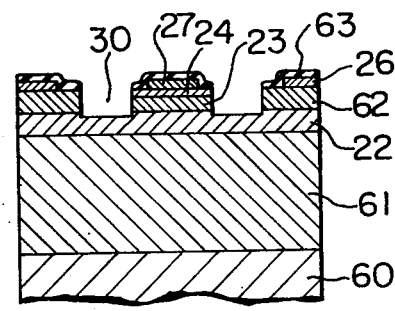

As is shown in FIG. 6c, a silicon dioxide layer 63 was deposited by chemical vapor deposition and selectively etched by photo-lithographic techniques. Further, a groove 30 was provided by the selective etching employing the silicon dioxide layer 63 as a mask.

Figure 6D:
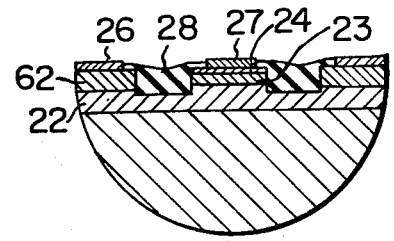

As is shown in FIG. 6d, the groove 30 was filled with glass or silicon dioxide 28, and the undoped Ga$_{1-x}$Al$_x$As layer 61 was polished into the shape of a dome, to form a dome-shaped light emitting diode according to the invention.

The luminous efficiency and the light emission output of the light emitting diode thus formed were measured to be 20–30% and 50–70 mW at a forward current density of 1,000 A/cm$^2$, respectively. Both values are approximately double those of a prior art light-emitting diode.

Although, in the above examples, Ga$_{1-x}$Al$_x$As was employed as the semiconductor material, similar effects can be attained for light emitting diodes which are made of mixed crystals of the other group III–V compound semiconductors, for example, GaAs$_{1-x}$P$_x$, Ga$_{1-x}$In$_x$As, GaAs$_{1-x}$Sb$_x$ and Ga$_{1-x}$In$_x$P, or light emitting diodes which have hetero-junctions formed of different group III–V compounds.

Regarding the growth of the respective epitaxial layers, although the liquid growth process was employed in the above aspects of performance, a vapor growth process can of course be similarly used.

In order to facilitate an understanding of the invention, the above description has been made of a single light-emitting diode throughout. However, a plurality of light emitting diodes according to this invention can be integrated into a functional device. Such a functional device according to the invention has a much higher luminous efficiency and light emitting output than a functional device in which a plurality of prior art light-emitting diodes are integrated. Moreover, it can be formed by the same processes as in the foregoing examples.

Accordingly, the invention is not restricted only to the discrete light-emitting diode described, but is covers, in its scope, a functional device formed by integrating a plurality of light emitting diodes.

We claim:

1. In a semiconductor light emitting device having a heterojunction and a p-n junction, wherein light is emitted from one side of said p-n junction, said p-n junction exhibiting characteristics of a hetero-junction, the improvement comprising a first semiconductor layer of p-type conductivity and a second semiconductor layer of n-type conductivity defining a p-n junction from which said light is emitted, said first semiconductor layer having a band gap smaller than that of said second semiconductor layer, wherein said first semiconductor layer has a band gap E$_p$, said second semiconductor layer has a band gap E$_n$, and wherein (E$_n$+E$_p$)+(twice the energy step of the conduction band) $\geq$ 3$k$T, where $k$ is Boltzmann's constant and T is absolute temperature.

2. The improvement according to claim 1, wherein each of said first and second semiconductor layers is made from a group III–V semiconductor compound.

3. The improvement according to claim 2, wherein one of said first semiconductor layer is p-type GaAs and said second semiconductor layer is n-type gallium-aluminum-arsenide.

4. The improvement according to claim 2, wherein said second semiconductor layer is n-type Ga$_{1-x}$Al$_x$As, where $x < 0.35$ and said first semiconductor layer is p-type gallium-aluminum-arsenide.

5. The improvement according to claim 1, wherein said device has a light emitting surface provided so that said hetero-junction lies between said light emitting surface and said first semiconductor layer.

6. A light-emitting semiconductor device having a light emitting surface comprising:
   a first semiconductor layer of a first p$^+$-conductivity type having a first surface of which forms said light emitting surface:
   a second semiconductor layer of said p-conductivity type forming a hetero-junction with said first semiconductor layer;
   a third semiconductor layer of a n-conductivity type forming a p-n junction with said second semiconductor layer, said p-n junction having characteristics of a hetero-junction; and
   first and second electrodes ohmically coupled to said first and third semiconductor layers, respectively, wherein said second semiconductor layer has an energy gap E$_p$ and said third semiconductor layer has an energy gap E$_n$, and wherein (E$_n$-E$_p$)—(twice the energy step of the conduction band) $\geq$ 3$k$T, where $k$ is Boltzmann's constant and T is absolute temperature.

7. The improvement according to claim 6, further comprising a fourth semiconductor layer of n$^+$ conductivity type disposed between and providing ohmic coupling between said third semiconductor layer and said second electrode.

8. The improvement according to claim 7, further comprising a layer of insulating material extending through respective apertures provided through said third and fourth semiconductor layers and into a groove partially extending into said second semiconductor layer, the cross-section of said apertures and groove for limiting the extent of the light generating region of said device.

9. The improvement according to claim 8, wherein said device is hemispherically shaped.

10. The improvement according to claim 6, wherein said second semiconductor layer is a p-type ternary compound group III–V semiconductor and said third semiconductor layer is an n-type ternary compound group III–V semiconductor.

* * * * *